United States Patent [19]

Rich et al.

[11] Patent Number: 5,163,159

[45] Date of Patent: Nov. 10, 1992

[54] DUAL MODE AUTOMATIC FREQUENCY CONTROL

[75] Inventors: Randall W. Rich, Palatine; Rashid M. Osman, Carol Stream; Thomas J. Walczak, Woodstock; Stephen V. Cahill, Palatine, all of Ill.

[73] Assignee: Motorola, Inc., Schaumburg, Ill.

[21] Appl. No.: 559,775

[22] Filed: Jul. 30, 1990

[51] Int. Cl.$^5$ .......................... H04B 1/40; H04B 1/16
[52] U.S. Cl. ..................................... 455/74; 455/142; 455/214; 375/5
[58] Field of Search .................. 455/74, 75, 142, 143, 455/214, 195, 324, 196, 199, 199.1, 196.1, 195.1, 197.1; 375/5; 340/825.44

[56] References Cited

U.S. PATENT DOCUMENTS

| | | | |
|---|---|---|---|
| 4,355,401 | 10/1982 | Ikoma et al. | 375/5 |
| 4,677,690 | 6/1987 | Reed | 455/324 |
| 4,704,734 | 11/1987 | Menich et al. | 455/33 |
| 4,852,086 | 7/1989 | Eastmond et al. | 375/5 |
| 4,893,094 | 1/1990 | Herold et al. | 455/343 |

Primary Examiner—Reinhard J. Eisenzopf
Assistant Examiner—Lisa Charouel
Attorney, Agent, or Firm—Robert H. Kelly

[57] ABSTRACT

A frequency control system for a dual-mode radiotelephone (152-238; 252-320) operative to receive either an FM signal or a DQPSK signal. In a first embodiment, when operative to receive the FM signal, the frequency of the reference oscillator (192) of the radiotelephone (152-222) is maintained in a fixed relation with the frequency of the FM signal. When operative to receive the DQPSK signal, the reference oscillator (192) is maintained in a fixed relation with the frequency of the DQPSK signal as determined by a digital signal processor (212). In a second embodiment, when operative to receive the FM signal, the frequency of an offset control oscillator (320) is maintained in a fixed relation with the frequency of the FM signal. When operative to receive the DQPSK signal, the reference oscillator (292) is maintained in a fixed relation with the frequency of the DQPSK signal as determined by a digital signal processor (312).

13 Claims, 5 Drawing Sheets

DUAL MODE AUTOMATIC FREQUENCY CONTROL

BACKGROUND OF THE INVENTION

The present invention relates generally to automatic frequency control apparatus, and, more particularly, to an automatic frequency control system for correcting frequency differences between a receiver and a transmitter which transmits either an analog information signal or a discrete, encoded information signal.

An information signal is impressed upon an electromagnetic wave by a process referred to as modulation. In a modulation process, the information signal is combined with an electromagnetic wave (referred to as the carrier wave), and the resultant, combined signal is an electromagnetic wave which varies in some manner according to the values of the information signal. Various modulation techniques have been developed to modulate the information signal upon the electromagnetic wave; amplitude modulation, frequency modulation, and phase modulation are three of such modulation techniques.

In general, an amplitude modulation signal is formed by modulating the information signal upon the electromagnetic wave such that the information signal modifies the amplitude of the electromagnetic wave corresponding to the value of the information signal. The frequency of the electromagnetic wave does not vary, and the information content of the modulated signal is contained in the shape, or amplitude, of the signal. The shape of the signal is referred to as the envelope of the signal, and the changes in the amplitude of the modulated signal change the envelope formed thereby. A frequency modulated signal is formed by altering the frequency of the electromagnetic wave corresponding to the value of the information signal. The amplitude of the electromagnetic wave does not vary, and the information content of the modulated signal is contained in the variation of the frequency of the signal. A phase modulated signal is formed by altering the phase of the electromagnetic wave corresponding to the value of the information signal. The amplitude of the electromagnetic wave does not vary, and the information content of the modulated signal is contained in the variation of the phase of the signal. Because the amplitudes of a frequency modulated and a phase modulated signal do not vary, these modulated signals are referred to as constant envelope signals.

A receiver which receives the modulated information signal includes circuitry to detect, or to otherwise recreate, the information signal modulated upon the electromagnetic wave. This process is referred to as demodulation, and various receiver circuits permits demodulation of information signals modulated upon an electromagnetic wave according to the various modulation techniques.

Many different modulated information signals may be simultaneously transmitted by a plurality of transmitters at a plurality of different frequencies.

Portions of a 100 megahertz band of the electromagnetic frequency spectrum (extending between 800 megahertz and 900 megahertz) are allocated for radiotelephone communication, such as, for example, by radiotelephones utilized in a cellular, communication system. A radiotelephone contains circuitry both to generate and to receive modulated information signals.

A cellular, communication system is created by positioning numerous base stations at spaced-apart locations throughout a geographical area. Each of the base stations is constructed to receive and transmit modulated information signals simultaneously to and from radiotelephones to permit two-way communication therebetween. The base stations are positioned at locations such that a radiotelephone at any location in the geographical area is within the reception range of at least one of the base station receivers.

The geographical area is divided into portions, and one base station is positioned in each portion. Each portion of the geographical area defined thereby is referred to as a "cell".

As mentioned hereinabove, a portion of the 100 megahertz frequency band is allocated for cellular communications. Although numerous modulated information signals may be simultaneously transmitted at different transmission frequencies, each occupies a finite portion of the frequency band. Overlapping of simultaneously transmitted modulated, information signals is not permitted as interference between overlapping signals on the same frequency could prevent detection of either of the modulated information signals by a receiver.

The frequency band is divided into channels, each of which is of a thirty kilohertz bandwidth. Presently, one signal is permitted to be transmitted in each thirty kilohertz-wide channel of the frequency band. Additionally, a first portion, extending between 824 megahertz and 849 megahertz, of the frequency band is allocated for the transmission of modulated information signals from a radiotelephone to a base station. A second portion, extending between 869 megahertz and 894 megahertz of the frequency band is allocated for the transmission of modulated information signals from a base station to a radiotelephone. 832 transmission channels are formed in the first frequency band portion, and 832 transmission channels are formed in the second frequency band portion, thereby permitting a maximum of 832 simultaneous, two-way communications within a geographical area.

A modulated signal transmitted upon any one of the transmission channels must be of a bandwidth less than the bandwidth of the transmission channel (i.e., less than thirty kilohertz). Oscillators which oscillate at frequencies to generate the electromagnetic carriers thereby are susceptible to frequency variations. Such variations, referred to as frequency drift, can cause the transmitted signal to extend beyond the boundaries of the transmission channel.

Increased usage of the cellular, communication systems has resulted, in many instances, in full utilization of every transmission channel allocated for cellular, radiotelephone communication. Other frequency bands of the electromagnetic spectrum are similarly oftentimes fully utilized.

Various attempts have been made to increase the information-transmission capacity of the cellular, radiotelephone communication systems as well as other communication systems utilizing other frequency bands of the electromagnetic spectrum. However, existing cellular radiotelephone communication systems are comprised of radiotelephones and base stations having circuitry which transmits and receives frequency modulated, analog signals. Only one modulated information signal may be transmitted upon a transmission channel at a time. Significant increases in the information-transmission capacity of cellular, radiotelephone communication systems has accordingly, been limited.

Discrete modulation techniques have been developed, however, to permit transmission of more than one signal at the same frequency. A cellular, radiotelephone communication system capable of transmitting modulated information signals formed by discrete modulation techniques would allow transmission of more than one signal on a transmission channel. The capacity of such a communication system can be significantly increased.

In general, a discrete modulation technique encodes a continuous, information signal into discrete signals and then modulates the discrete signals upon an electromagnetic wave to form thereby a modulated information signal. Discrete signals of more than one information signal may be modulated upon electromagnetic waves of identical carrier frequencies and transmitted sequentially to two or more radiotelephones.

Frequency drift may be a greater problem when certain discrete, encoded signals are transmitted. Oscillators which generate electromagnetic waves upon which information signals are modulated are susceptible to frequency drift responsive to changes in ambient conditions, such as, for example, temperature changes and supply voltage variations. A frequency drift of a magnitude which maintains a conventional, analog signal within the boundaries of a transmission channel, may oftentimes be of a magnitude which causes a corresponding discrete, encoded signal to extend beyond the boundaries of a transmission channel. Frequency drift of modulated information signals generated by discrete modulation techniques may be more susceptible to interference problems than are modulated information signals generated by conventional analog modulation techniques.

Additionally, circuitry for demodulating transmitted information signals of certain discrete, encoded-type signals requires less frequency error than the frequency error permitted of conventional, analog signals. Quantitatively, the U.S. cellular standard frequency error permitted of conventional, analog signals is 2.5 parts per million, whereas frequency error permitted of discrete, encoded signals is approximately 0.2 parts per million.

Systems and methods of frequency control for minimizing frequency drift to minimize thereby frequency drift problems are known and are frequently utilized in many existing communication systems. Generally, one oscillator, referred to as the reference oscillator, within a transmitter is controlled such that frequency drift of a signal generated thereby is within an allowable range. Other oscillators of the radio may then be locked to the frequency of the reference oscillator.

In the particular instance of the cellular, radiotelephone communications as above-described, the oscillators of the base stations positioned throughout the geographical area to modulate an information signal thereupon may be precisely controlled to minimize drift of the frequency of the electromagnetic wave generated thereby. The receivers of the radiotelephones may utilize the frequency of the modulated information signal from the base station as a reference frequency. The reference frequency is utilized by the radiotelephone, for example, as reference from which the transmit frequency of the radiotelephone may be offset allowing the signal transmitted by the radiotelephone to be as precise of a frequency as the base station frequency.

In order to increase the capacity of cellular, communication systems, existing base stations having circuitry to transmit and receive only conventional analog signals are to be converted to base stations which additionally permit transmission and reception of discrete, encoded, modulated information signals. Radiotelephones are being developed to permit transmission and reception of both conventional analog signals, and discrete encoded signals. As the cellular system base stations are gradually converted, and radiotelephones are similarly developed, some channels of a cell will be comprised of receivers having circuitry permitting reception of discrete, encoded modulated information signals, and other channels will be comprised of receivers having circuitry permitting only reception of conventional analog modulated information signals. Similarly, some radiotelephones operated in the cellular, communication systems will contain circuitry permitting transmission and reception of both discrete, encoded modulated information signals and conventional, analog modulated information signals. Other radiotelephones will contain circuitry permitting transmission and reception of only conventional, analog, modulated information signals.

A dual-mode radiotelephone permitting transmission of both conventional, analog modulated information signals, and discrete, encoded modulated information signals may be constructed having both first circuitry for transmission and reception of the conventional, analog modulated information signals, and second circuitry for transmission and reception of discrete, encoded modulated information signals. When a radiotelephone receives a discrete encoded signal, a digital signal processor may be conveniently utilized to decode the signal. At the same time, the digital signal processor may be utilized to derive an error signal to correct the reference frequency in the radiotelephone.

While a digital signal processor may be utilized to generate the error signal to correct the reference frequency when an analog signal is received, the digital signal processor dissipates larger amounts of power than conventional analog circuitry used to determine the reference frequency of a conventional, analog modulated information signal. The conventional, analog circuitry is, however, unsatisfactory for determining a reference frequency for discrete encoded, information signals.

A radiotelephone operable to receive both conventional analog and discrete, encoded, modulated information signals having circuitry to determine a reference frequency of either type of transmitted signal, and, additionally, having minimal power consumption requirements would be advantageous.

What is needed, therefore, is a frequency control scheme which requires minimal power consumption, but also may be alternately operated to determine the reference frequency of either conventional, analog modulated information signals or discrete, encoded modulated information signals transmitted to the radiotelephone.

SUMMARY OF THE INVENTION

It is, accordingly, an object of the present invention to provide a frequency control system for correcting frequency differences between a transmitter and a receiver operable to transmit and receive both analog and discrete, encoded, modulated information signals.

It is a further object of the present invention to provide a frequency control system operable to determine a reference frequency of a signal transmitted either by conventional, analog modulation techniques, or by discrete modulation techniques which requires a minimal power consumption for operation thereof.

It is a yet further object of the present invention to provide a dual-mode radiotelephone operable to receive both a conventional, analog information signal and a discrete, encoded signal having frequency control circuitry of minimal power requirements.

In accordance with the present invention, therefore, a frequency control system for correcting frequency differences between a receiver operable to receive an information signal modulated upon a carrier wave characterized by a certain frequency to form thereby a modulated information signal, and a transmitter which transmits the information signal is disclosed. The modulated information signal is received, and analog signal detection circuitry determines the certain frequency characterizing the carrier wave when the information signal is an analog signal, and generates a first frequency reference signal indicative of the certain frequency determined thereby. Discrete signal detection circuitry determines the certain frequency characterizing the carrier wave when the information signal is a discrete, encoded signal, and generates a second frequency reference signal indicative of the carrier frequency determined thereby. The oscillation frequency of a variable frequency oscillator is altered responsive to values of the first frequency reference signal or the second frequency reference signal, to correct thereby frequency differences between the receiver and the transmitter.

BRIEF DESCRIPTION OF THE DRAWINGS

The present invention will be better understood when read in light of the accompanying drawings in which:

FIG. 2A and 2B are graphical representations of constant envelope signals wherein

DESCRIPTION OF THE PREFERRED EMBODIMENTS

Figure 1:
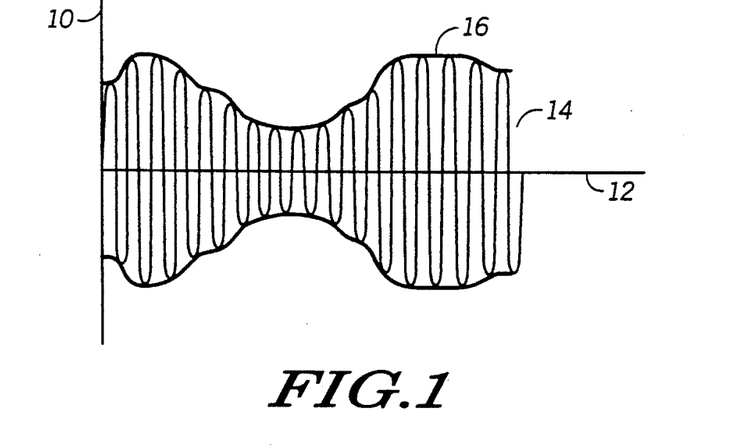
FIG. 1 is a graphical representation of an amplitude modulated information signal representative of one such signal which may be utilized by the frequency control system of the present invention.
Figure 2A:
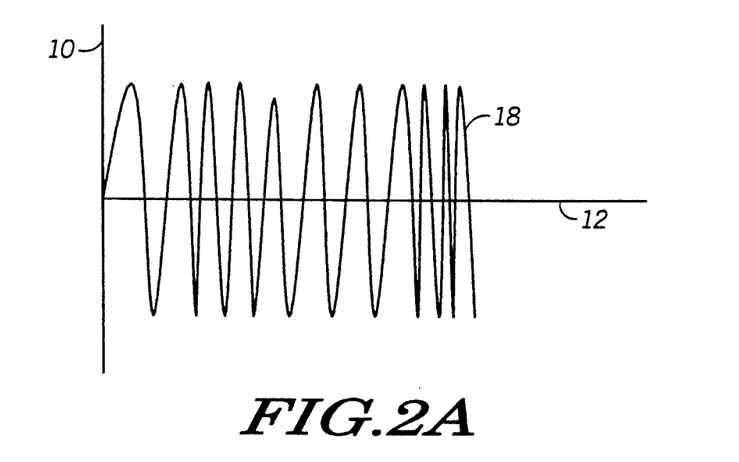
FIG. 2A is a frequency modulated signal representative of one such signal that may be utilized by the frequency control system of the present invention.
Figure 2B:
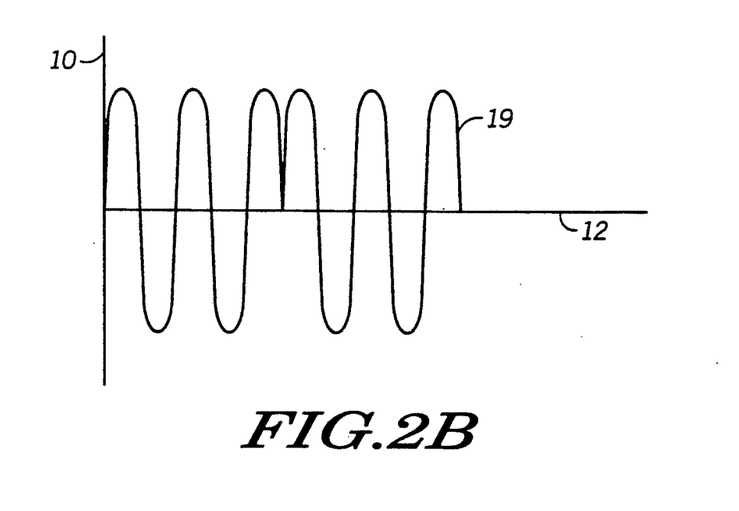
FIG. 2B is a phase modulated signal representative of another such signal that may be utilized by the frequency control system of the present invention.

Turning first now to the graphical representations of FIGS. 1 and 2A-2B, waveforms representative of three types of modulated information signals are shown. Waveforms similar to the waveforms of FIGS. 1 and 2A-2B (or, more particularly, a waveform similar to the waveform of FIG. 2A, and a waveform similar to the combination of FIG. 1 and FIG. 2B) may be utilized by the system of the present invention for correcting frequency differences between a receiver operable to receive such waveforms, and a transmitter operable to transmit such waveforms. The waveforms are actually plots of voltage, scaled in terms of millivolts, on ordinate axes 10, as a function of time, plotted along abscissa axes 12.

Waveform 14 of FIG. 1 is an amplitude modulated signal formed by modulating an information signal upon an electromagnetic wave wherein the amplitude (i.e., voltage of the waveform 14 varies responsive to values of the information signal modulated thereupon. The information-containing portion of waveform 14 is, thereby, contained in the amplitude of the waveform such that variations in the amplitude of the waveform 14 correspond to variations in the amplitude of the information signal. The amplitude of waveform 14, referred to as the envelope of the waveform, is represented in FIG. 1 by curve 16. Curve 16 is similar in shape to the information signal which, when modulated upon an electromagnetic wave forms waveform 14. Waveform 24 does not vary in frequency, and the frequency of waveform 14 corresponds to the frequency of the unmodulated wave upon which the information signal is modulated. Such frequency is referred to as the carrier frequency of waveform 14, and the electromagnetic wave is referred to as the carrier wave.

Waveform 18 of FIG. 2A is a frequency modulated signal formed by modulating an information signal upon an electromagnetic wave. The amplitude of waveform 18 does not vary; however, the frequency of waveform 18 varies responsive to values of the information signal modulated thereupon. Variations in frequency of waveform 18, thus, form the information-containing portion of the waveform. The variation in frequency of waveform 18 caused by modulation of the information signal upon the electromagnetic wave is, however, slight, compared to the frequency of the electromagnetic wave. Hence, waveform 18 may, similar to the waveform 18 of FIG. 1, be characterized by the frequency of the electromagnetic wave upon which the information signal is modulated; such frequency is referred to as the carrier frequency of the waveform 18, and the electromagnetic wave is referred to as the carrier wave.

Waveform 19 of FIG. 2B is a phase modulated signal formed by modulating an information signal upon an electromagnetic wave. The amplitude of waveform 19 does not vary; however, the phase of the waveform 19 varies responsive to values of the information signal modulated thereupon. Variations in phase of the waveform, thus, form the information-containing portion of waveform 19. It is to be noted that the abrupt phase change of waveform 19 of FIG. 2B is for purposes of illustration only, and that an actual phase modulated signal would exhibit a gradual phase change. The phase variation of waveform 19 does not significantly alter the carrier frequency of the signal. tehrefore, wave 19, once modulated, may (similar to waveform 14 of FIG. 1 and waveform 18 of FIG. 2A) be said to be characterized by the carrier frequency.

Figures 3, 4, 5:
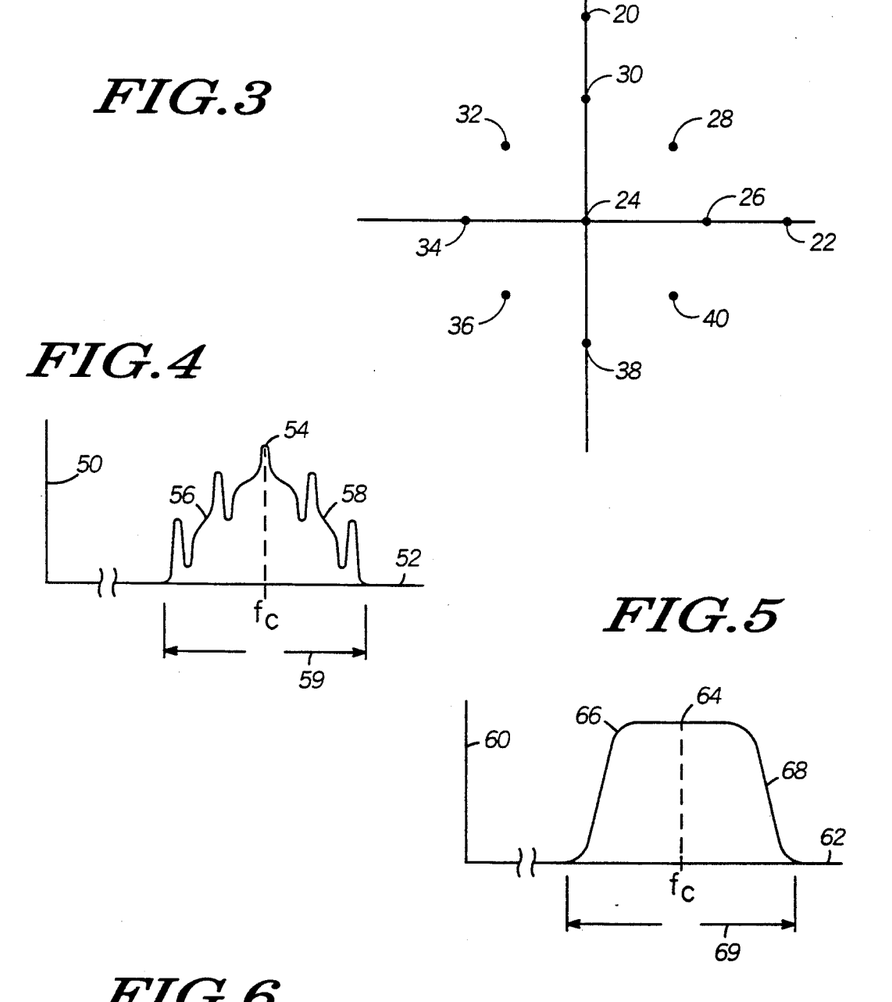
FIG. 3 is a graphical representation of the constellation points of a discrete encoding scheme which may be utilized to encode an information signal to form thereby a discrete, encoded signal.
FIG. 4 is a graphical representation of the frequency modulated signal of FIG. 2A graphed as a function of frequency.
FIG. 5 is a graphical representation of a DQPSK signal, which is a combination of an amplitude modulated signal and a phase modulated signal, graphed as a function of frequency.

Turning now to the graphical representation of FIG. 3, the constellation points of a discrete encoding scheme for encoding an information signal is illustrated. As mentioned hereinabove, by encoding an information signal into a series of discrete, encoded signals, more than one signal may be transmitted at a particular frequency to increase significantly thereby the information-transmission capacity of a particular frequency band.

FIG. 3 illustrates an eight-level phase shift keying (PSK) system in which an information signal may take the form of any of eight different levels (i.e., phases). Other discrete, encoding schemes are, of course, similarly possible. In this system, the information signal is encoded into two parallel bit streams, referred to as I(t) and Q(t). At the sampling instants $t_i$, I($t_i$) and I($t_i$) form a vector whose possible values (i.e., vector tips) are graphically represented in FIG. 3. Ordinate axis 20 and abscissa axis 22 are scaled in terms of the magnitude of Q(t) and I(t). Such a vector may be modulated upon an electromagnetic wave to form thereby a modulated information signal wherein the information content of the signal is comprised of a series of discrete signal levels (or phases).

The encoding scheme of FIG. 3 illustrates the standard selected for digital, cellular radiotelephone communication systems to be implemented in the United States. With particular respect to the United States standard, only four differential changes between any two sequential vectors are permitted. Such an encoding scheme is referred to as a differential quaternary phase shift keying (DQPSK) system.

FIG. 4 is a graphical representation of waveform 18 of FIG. 2A plotted as a function of frequency. Ordinate axis 50 of FIG. 4 represents the power of a signal, scaled in terms of milliwatts, plotted as a function of frequency, scaled in terms of hertz, on abscissa axis 52. The waveform is centered about a center frequency, $f_c$, indicated by reference numeral 54. Sidebands 56 and 58 form the information-containing portion of the waveform. The bandwidth of the FM signal is indicated by segment 59.

Turning now to the graphical representation of FIG. 5, a waveform upon which a DQPSK signal is modulated is plotted as a function of frequency. A DQPSK modulated signal is a composite modulated signal having both amplitude modulation components (similar to FIG. 1) and phase modulation components (similar to FIG. 2B). The power of the waveform, scaled in terms of milliwatts on ordinate axis 60, is plotted as a function of frequency, scaled in terms of hertz, on abscissa axis 62. The signal is centered about a center frequency, $f_c$, indicated by reference numeral 64. Center frequency 64 defines sidebands 66 and 68. The bandwidth of the DQPSK signal is indicated by segment 69.

Figure 6:
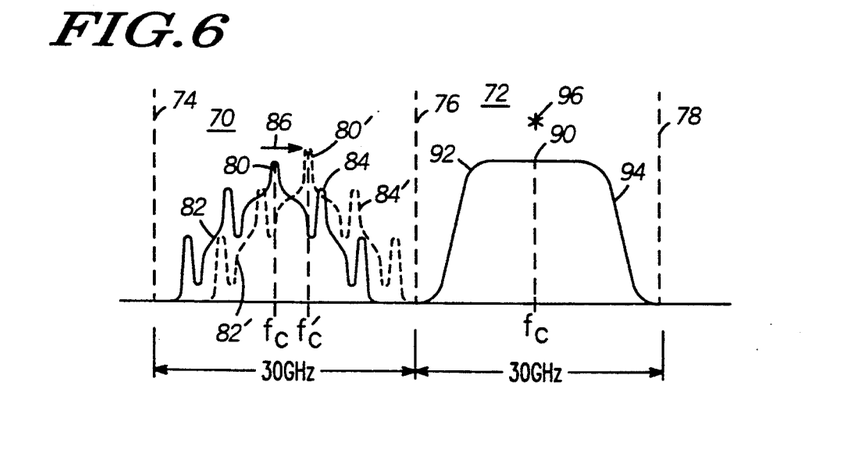
FIG. 6 is a graphical representation of two adjacent transmission channels of a frequency band, wherein a conventional, modulated information signal is transmitted upon a first of the transmission channels, and a discrete, encoded modulated information signals is transmitted upon a second of the transmission channels.

FIG. 6 is a graphical representation of two adjacent transmission channels wherein each transmission channel is of a bandwidth of thirty kilohertz. Hatched lines 74, 76, and 78 of FIG. 6 indicate the respective boundaries of the adjacent channels 70 and 72, wherein line 76 indicates the boundary between channels 70 and 72. Similar to the graphs of FIGS. 4–5, the waveforms plotted in FIG. 6 are plots of power as a function of frequency. For purposes of illustration, the waveform plotted in transmission channel 70 is a frequency modulated signal having center frequency 80 and sidebands 82 and 84. As described hereinabove, sidebands 82 and 84 represent the information-containing portion of the modulated information signal.

A certain amount of frequency drift of a transmitted signal is permitted while still maintaining sidebands of the signal within the thirty kilohertz bandwidth of channel 70. For an analog, frequency modulated signal plotted in transmission channel 70, permissible frequency drift of the signal is indicated by arrow 86 pictured above center frequency 80. Arrow 86 illustrates the allowable positioning of the center frequency 80 of the signal while still maintaining the signal within the boundaries of channel 70. Drift of the carrier wave of the modulated information signal which does not exceed in frequency the drift indicated by arrow 86 maintains the sidebands 82 and 84 within the thirty kilohertz bandwidth of the channel 70. Quantitatively, the frequency drift permitted of the signal is approximately 2,100 hertz on either side of the center frequency. The signal centered about center frequency $f_c'$, indicated by reference numeral 80', indicates a frequency modulated signal which has drifted upwards in frequency, but still within the permissible frequency drift. Sidebands 82' and 84', are maintained within the boundaries 74 and 76 of transmission channel 70. It is to be noted, however, hat further increase in the drift of the waveform would cause sideband 84' to extend beyond the boundary 76 separating transmission channels 70 and 72. Such a drift can result in overlapping of signals of the adjacent channels, and thereby cause interference therebetween.

Transmission channel 72 shown in the right-hand portion of FIG. 6 defines a thirty kilohertz transmission channel extending between hatched lines 76 and 78. For purposes of illustration, a DQPSK modulated information signal is positioned within the transmission channel 72. The modulated information signal, similar to the signal of FIG. 5, is centered about a center frequency, $f_c$, indicated by reference numeral 90. Center frequency 90 defines sidebands 92 and 94.

The frequency drift permitted of a discrete signal such as the signal illustrated in transmission channel 72 is less than the frequency drift permitted of a conventional analog signal (such as the signal illustrated in transmission channel 70). Arrow 96 pictured above center frequency 90 illustrates the permitted frequency drift of the discrete, encoded signal of transmission channel 72. Arrow 96 corresponds to arrow 86 pictured above impulse spike 80 of the transmission channel 70, and defines the permitted frequency drift of the discrete, encoded signal. Quantitatively, the frequency drift permitted of a discrete, encoded signal is approximately 200 hertz on either side of the center frequency. This permissible drift is approximately one order of magnitude less drift than that permitted of a conventional analog signal.

The much smaller frequency drift permitted of a DQPSK signal is due, not only because of spilling of the signal into adjacent channels, but, also, because receiver circuitry for receiving and demodulating a DQPSK signal cannot receive and demodulate a DQPSK signal as accurately when it is shifted in frequency.

While frequency control (i.e. locking) is advantageous (and sometimes necessary to prevent overlapping of signals) to minimize frequency drift of a conventional analog signal, frequency control is virtually always necessary when certain discrete, encoded signals are transmitted. Digital signal processors may be constructed to provide an indication of the center frequency (or other reference frequency) of any transmitted signal whether the signal is a conventional analog signal or a discrete, encoded signal. The power consumption of a digital signal processor is, however, significant. When discrete, encoded signals are transmitted, a digital signal processor is required to be operative only intermittently when the discrete, encoded signals are transmitted.

Figure 7:
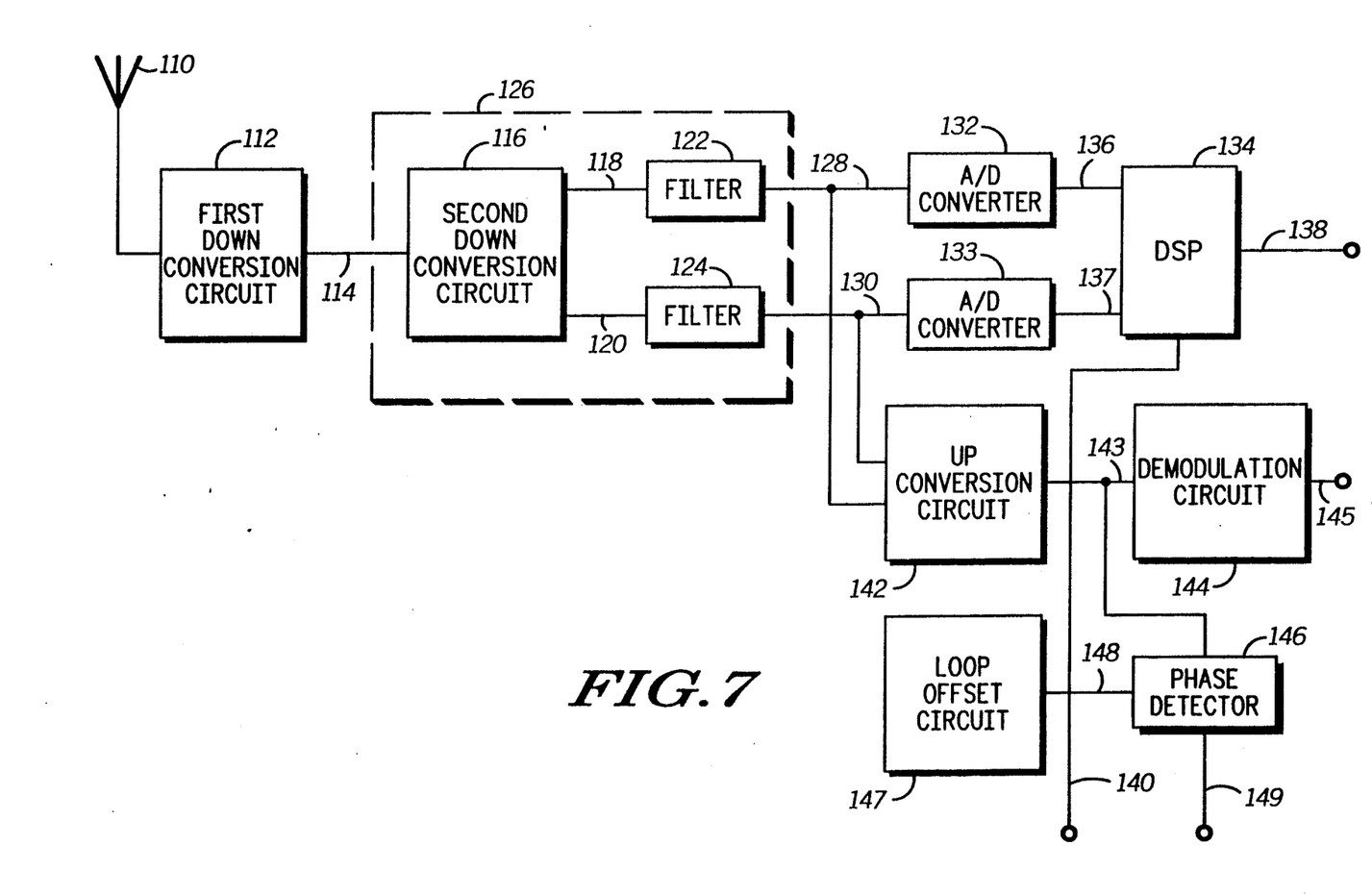
FIG. 7 is a block diagram of the frequency control system of the present invention.

Turning now to the block diagram of FIG. 7, the elements of the frequency control system of the present invention are shown in functional block form. The frequency control system embodying the present invention is operative to determine the center, or other reference, frequency of either a discrete, encoded modulated information signal, or a conventional, analog modulated information signal. A digital signal processor is operative only when the transmitted information signal is a discrete, encoded signal, and, then, only when the discrete, encoded signal is received, thereby minimizing the power consumption of the processor.

Alternatively, when receiving an analog information signal, the digital signal processor may be utilized to determine the reference frequency of the transmitted signal.

The transmitted signal, either a conventional, analog signal, or a discrete, encoded signal, is transmitted to an antenna (or other electromagnetic wave receiving device) 110. The signal received by antenna 110 is filtered and amplified, if necessary, and supplied to first down conversion circuit 112. Down conversion circuit 112 converts the transmission frequency signal (which may, for example, be of 890 megahertz) into a signal of a lower frequency, such as, for example, 45 megahertz. Down conversion circuit 112 generates the lower frequency signal on line 114 which is coupled to second down conversion circuit 116. Second down conversion circuit 116 converts the signal supplied thereto on line 114 to a baseband signal. Down conversion circuit 116 generates an in-phase signal on line 118 and a signal in-phase quadrature therewith on line 120. The in-phase signal generated on line 118 is supplied to baseband filter 122, and the quadrature signal generated on line 120 is supplied to baseband filter 124. Down conversion circuit 116 and filters 122 and 124 may together comprise a single integrated circuit chip, referred to as a zero intermediate frequency (ZIF) circuit illustrated by block 126, shown in hatch.

Filtered signals generated by filters 122 and 124 are generated on lines 128 and 130, respectively. Filters 122 and 124 contain passbands to pass signals of desired frequencies.

When antenna 110 receives a discrete, encoded signal, the filtered signal generated by filters 122 and 124 are supplied to analog-to-digital converter 132 and 133. The digital signals generated by A/D converters 132 and 133 are supplied to digital signal processor 134 on lines 136 and 137. Digital signal processor processes the digital signal supplied thereto, and generates an audio signal on line 138 indicative of the information signal transmitted in discrete, encoded form to antenna 110. Digital signal processor 134 also generates an output signal on line 140 which is indicative of the center, or other reference, frequency of the transmitted signal. The signal generated on line 140 may be utilized to lock the frequency of the receiver to the center, or other reference, frequency of the transmitted signal.

When the signal transmitted to antenna 110 is a conventional, analog signal, the filtered signals generated by filters 122 and 124 are supplied to up-conversion circuit 142.

Up conversion circuit 142 converts the filtered, in-phase and filtered, quadrature phase signals generated on lines 128 and 130, respectively, to a higher-frequency signal, and such signal is generated on line 143. The signal generated on line 143 is supplied to the demodulation circuit 144. The demodulation circuit 144 demodulates the signal supplied thereto by conventional frequency demodulation techniques. Conversion of the baseband signals generated on lines 128 and 130 into a higher frequency signal is required for demodulation by conventional demodulation circuitry.

Demodulation circuit 144 generates an audio signal on line 145 which is representative of the information signal portion of a conventional, analog modulated signal received by antenna 110.

The signal generated by up-conversion circuit 142 on line 143 is also supplied to phase detector 146. Phase detector 146 compares the frequency of the up conversion circuit 143 output to a frequency of the signal generated by the offset loop circuit 147 to generate an output signal on line 149 which is indicative of the center, or other reference, frequency of the transmitted signal.

Because a transmitter which transmits a modulated information signal, and, which in particular instance of a cellular communication system comprises a base station, generally is of a size which permits means for preventing frequency drift caused by ambient conditions and voltage irregularities to form a portion of a transmitter, the center, or other reference, frequency of the transmitted signal may be used as a reference frequency by the receiver.

Figure 8:
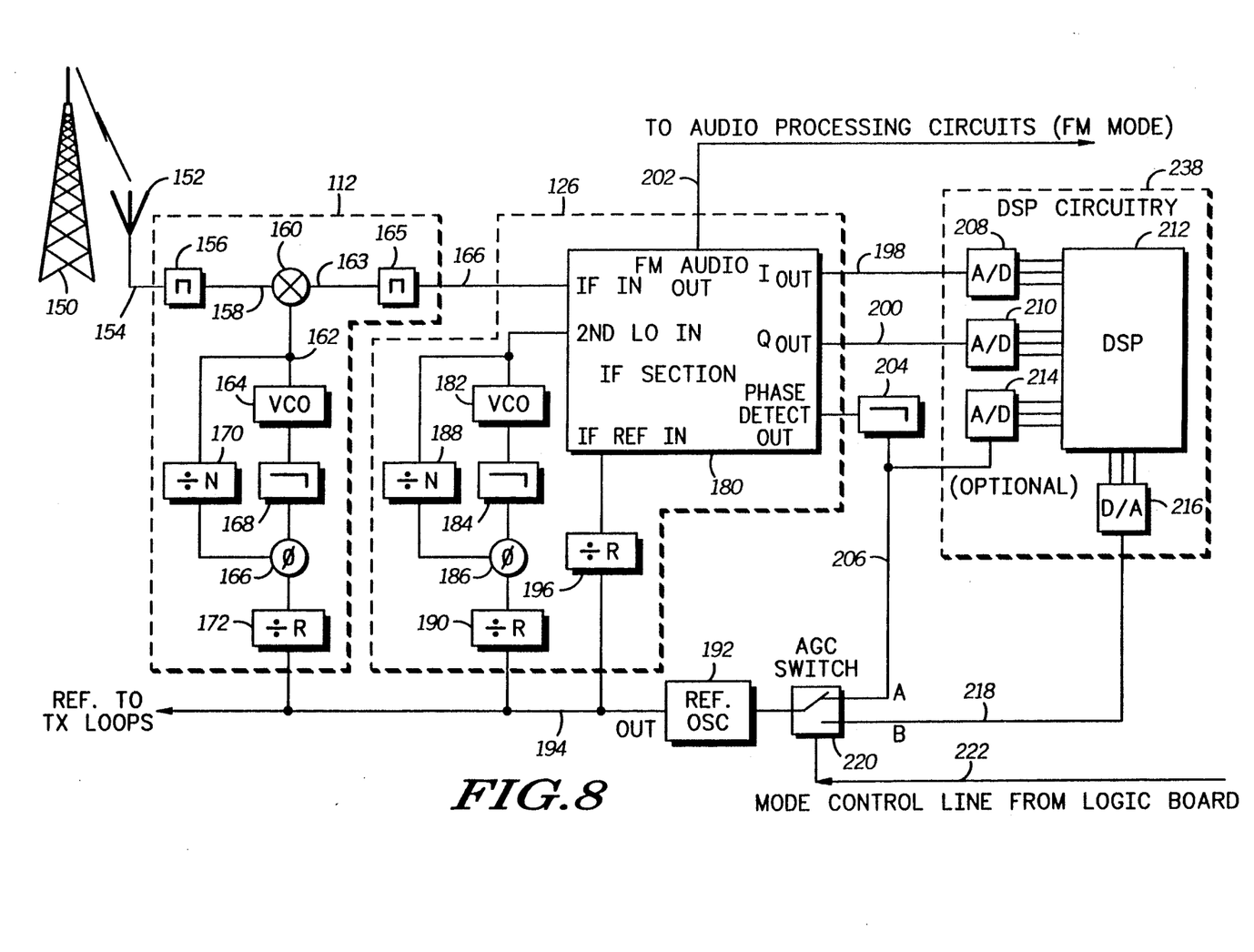
FIG. 8 is a partial block, partial schematic illustration of a preferred embodiment of the present invention.

Turning now to the partial block, partial schematic illustration of FIG. 8, a preferred embodiment of the frequency control system of the present invention is shown. A modulated, information signal, either a conventional, analog signal or a discrete, encoded signal is transmitted by transmitter 150 and is received by antenna 152.

Antenna 152 supplies the received signals on line 154 to filter 156. Filter 156 forms a passband to pass signals of frequencies within a desired frequency range on line 158. The signals passed by filter 156 are supplied to mixer circuit 160 to down convert the modulated signal received by antenna 152. Mixer 160 receives an oscillating signal on line 162 generated by voltage control oscillator 164. Voltage control oscillator 164 forms a portion of a conventional phase locked loop (PLL) circuit including phase detector 166, filter 168, and dividing circuits 170 and 172. The signal mixed by mixer 160 is supplied on line 163 to filter 165. Filter 165 contains a passband to pass signals of desired frequencies on line 166. Line 166 is coupled to an intermediate frequency input of zero intermediate frequency (ZIF) section circuit 180. Mixer 160, oscillator 164 and the associated PLL circuit, and filter 165 are enclosed by block 112, shown in hatch, to correspond with down conversion circuit 112 shown in the block diagram of FIG. 7.

Circuitry forming a second PLL circuit, comprised of voltage controlled oscillator 182, lowpass filter 184, phase detector 186 and dividing circuits 188 and 190, provides an oscillating signal to the second LO input of circuitry 180. The second PLL circuit and circuitry 180 are enclosed by block 126, shown in hatch, to correspond with the zero intermediate frequency circuit 126 of FIG. 7.

Reference oscillator 192 generates an oscillating signal on line 194 which is divided by dividing circuitry 196 to supply a reference oscillating signal to the intermediate frequency reference input of circuitry 180. Line 194 also is coupled to the oscillator circuitry connected to the second LO input of circuitry 180, and to the PLL circuit which provides an oscillating signal on line 162 to mixer 160 to provide thereby an oscillating signal to each of the PLL circuits.

Intermediate frequency section circuitry 180 generates I and Q output signals on lines 198 and 200, respectively, when the modulated signal received by antenna 152 is comprised of a discrete, encoded signal. When the modulated signal received by antenna 152 is comprised of a conventional, analog signal, intermediate frequency section circuitry 180 generates an audio output on line 202. Line 202 is coupled to audio processing circuit (not shown). When antenna 152 receives the conventional, analog modulated signal, circuitry 180 further generates a phase detection output which is supplied to filter 204. Filter 204 generates a filtered output signal on line 206 indicative of the phase, or frequency, of the signal received by antenna 152.

When circuitry 180 generates I and Q output signals on lines 198 and 200, the generated output signals are supplied to analog-to-digital converters 208 and 210, respectively. A/D converters 208 and 210 provide digital signals to digital signal processor 212. When FIG. 8 illustrates parallel connections between converters 208 and 210, and processor 212, it is to be noted that serial connections are similarly possible.

Processor 212 further receives phase angle, or frequency, information indicated by the filtered signal generated by filter 204 which is supplied to the processor 212 through analog-to-digital converter 214. Digital signal processor 212 processes the I and Q signals and the frequency information supplied thereto, and generates output signals which are converted to an analog signal by digital-to-analog converter 216.

The analog signal generated by D/A converter 216 is supplied on line 218 to frequency control switch 220. Line 206 is additionally coupled to frequency control switch 220. Switch 220 is actuated by an external signal supplied thereto on line 222 which alternately connects line 206 or line 218 to the reference oscillator 192. The signals supplied on lines 206 and 218 are indicative of the frequency of the signals received by antenna 152. As described hereinabove, the signal on line 206 is indicative of the frequency of the received signal when the signal is a conventional, analog signal, and the signal supplied on line 218 is indicative of a discrete, encoded signal received by antenna 152. The signal supplied on lines 206 and 218, respectively, are utilized to alter the oscillating frequency of oscillator 192. More particularly, the changes in frequency of oscillator 192 corresponds to the changes in the frequency of the signal transmitted to antenna 152.

Switch 220 may, for example, be comprised of any electronic controllable, or other, switch. For example, switch 220 may be comprised of CMOS transmission gates arranged in the form of a 2:1 multiplexer.

Figure 9:
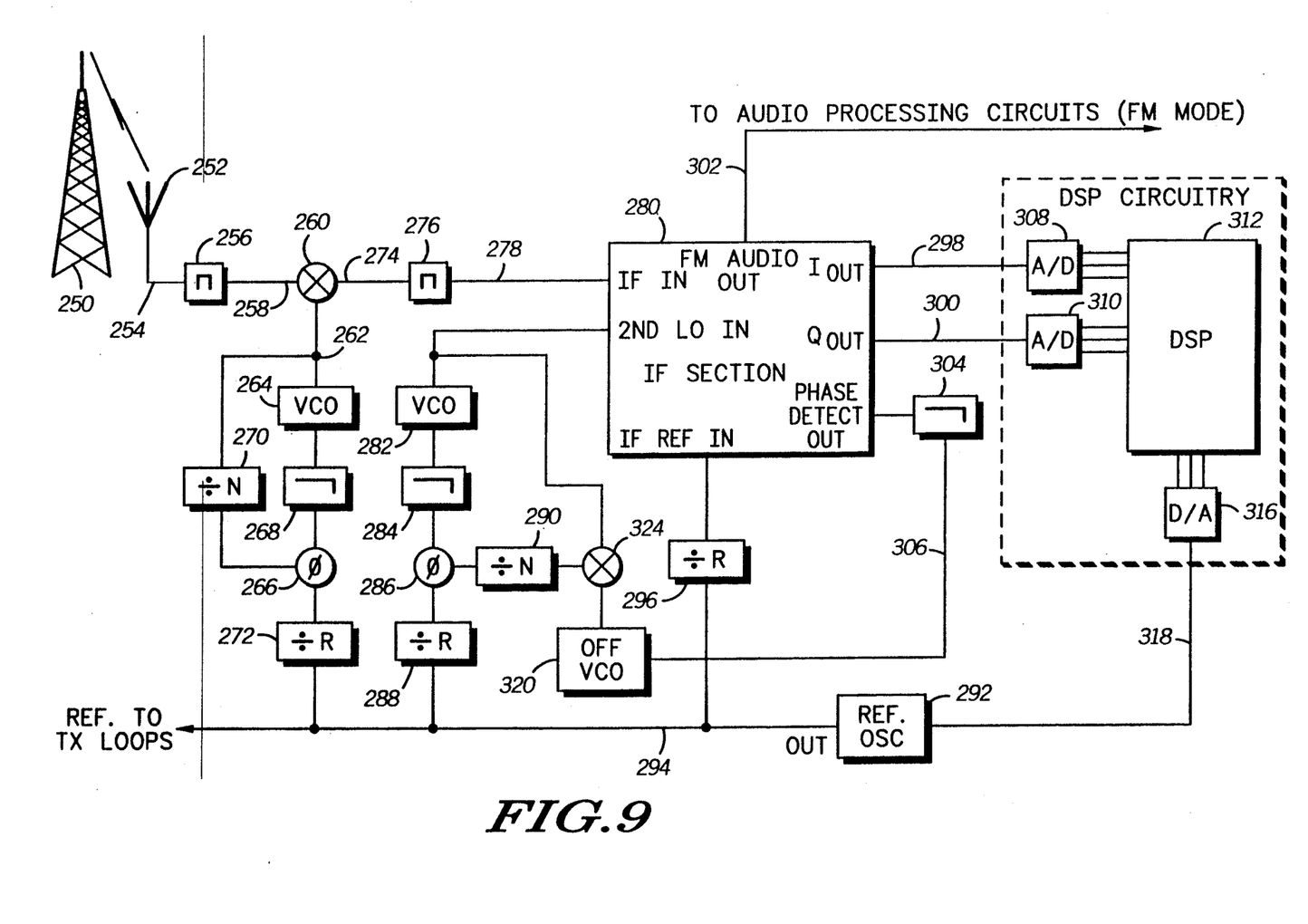
FIG. 9 is a partial block, partial schematic illustration of an alternate preferred embodiment of the present invention.

Turning now to the partial block, block schematic illustration of FIG. 9, an alternate preferred embodiment of the present invention is illustrated. Similar to the embodiment of FIG. 8, a signal, either a conventional, analog modulated information signal, or a discrete, encoded modulated information signal is transmitted by transmitter 250 and is received by antenna 252. Antenna 252 supplies the received signals on line 254 to bandpass filter 256. Bandpass filter 256 forms a passband to pass signals of a desired frequency range on line 258 to mixer 260 to "down-convert" the modulated signals received by antenna 252. Mixer 260 receives an oscillating signal on line 262 generated by voltage control oscillator 264. Voltage control oscillator 264 forms a portion of a conventional PLL circuit including phase detector 266, filter 268, and divider circuits 270 and 272. The signal mixed by mixer 260 is supplied on line 274 to bandpass filter 276. Bandpass filter 276 contains a passband to pass signals of desired frequencies on line 278 to the intermediate frequency input of intermediate frequency circuitry 280.

Circuitry forming a PLL comprised of voltage control oscillator 282, lowpass filter 284, phase detector 286, and divider circuits 288 and 290 provide an oscillating signal to the second LO input of circuitry 280.

Reference oscillator 292 generates an oscillating signal on line 294 which is divided by dividing circuitry 296 and supplied to an intermediate frequency reference input of circuitry 280. Line 294 is also coupled to the oscillator connecting the second LO input of circuitry 280, and to the PLL circuitry which provides an oscillating signal on line 262 to mixer 260 to provide thereby an oscillating signal to each of the PLL circuits.

Intermediate frequency section circuitry 280 generates I an Q outputs on lines 298 and 300, respectively, when the modulated signal received by antenna 252 is comprised of a discrete, encoded signal. When a modulated information signal received by antenna 252 is comprised of a conventional, analog signal, intermediate frequency section circuitry 280 generates an audio output signal on line 302. Line 302 is coupled to audio processing circuitry (not shown). When antenna 252 receives a conventional, analog modulated information signal, circuitry 280 further generates a phase detection output which is supplied to filter 304. Filter 304 generates a filtered output signal on line 306 indicative of the phase, or frequency, of the signal received by antenna 252.

Intermediate frequency section circuitry 280 generates I and Q output signals on lines 298 and 300, respectively, when the modulated signal received by antenna 252 is comprised of a discrete, encoded signal. The I and Q output signals formed on lines 298 and 300, respectively, are supplied to analog-to-digital converters 308 and 310. A/D converters 308 and 310 provide digital signals to digital signal processor 312. While FIG. 9 illustrates parallel connections between converters 308 and 310, and processor 312, it is to be noted that serial connections are similarly possible. Digital signal processor 312 processes the I and Q signals supplied thereto, and generates outputs which are converted to an analog signal by digital-to-analog converter 316. The analog signal generated by digital-to-analog converter 316 is supplied on line 318 to reference oscillator 292.

The embodiment of FIG. 9 differs from that of FIG. 8 in that instead of supplying the signals generated on lines 306 and 318 to a switch, the signal generated on line 318 is supplied directly to reference oscillator 292, and the signal supplied on line 306 is supplied to offset voltage control oscillator 320. Offset oscillator 320 generates an oscillating signal on line 322 which is supplied to an image reject mixer 324. Reference oscillator 292 is fixed to a preset value, and the LO loop is locked to the frequency of reference oscillator 292. When antenna 252 receives a conventional, analog modulated information signal, the digital signal processor 312 is disabled, and the I and Q signals are not utilized; rather, the phase detection output signal generated by circuitry 280, is supplied to filter 304. The filtered signal generated by filter 304 is supplied on line 306 to offset oscillator 320 which, when connected as illustrated, alters the oscillating frequency of the second LO input. When antenna 252, conversely, receives a discrete, encoded modulated information signal, oscillator 320 is disabled, causing unbalancing of the image reject mixer 324 such that the second LO feedback signal passes through circuit 324, and the second LO divided by N circuit is reprogrammed. This locks the second LO to the frequency of reference oscillator 292, and digital signal processor 312 generates a control signal on line 318 to alter the frequency of oscillator 292 corresponding to the frequency of the signal received by antenna 252.

Reference oscillator 192 of FIG. 8, and reference oscillator 292 of FIG. 9, may, for example, be comprised of a current controlled oscillator when the signal supplied on lines 206 and 218, and line 318 are current signals. Alternately, oscillators 192 and 292 may be comprised of data driven oscillators when the signals supplied on lines 206 and 218, and on line 318 are comprised on data signals. A data driven reference oscillator is advantageous for the reason that noise generated on a control line does not cause frequency variations.

While the present invention has been described in connection with the preferred embodiments of the various figures, it is to be understood that other similar embodiments may e used and modifications and additions may be made to the described embodiments for performing the same function of the present invention without deviating therefrom. Therefore, the present invention should not be limited to any single embodiment, but rather construed in breadth and scope in accordance with the recitation of the appended claims.

We claim:

1. A frequency control system operable to maintain a receiver oscillation frequency of at least one variable oscillator forming a portion of a receiver in a desired frequency relationship with an oscillation frequency of a modulated signal transmitted to the receiver and received thereat, said frequency control system comprising:
    means for converting the modulated signal received by the receiver into an electrical signal of signal characteristics indicative of the modulated signal;
    analog signal detection circuitry coupled to receive the electrical signal generated by the means for converting and operative when the modulated signal comprises a frequency modulated signal, said analog signal detection circuitry having a phase detector for detecting frequency characteristics of the electrical signal indicative of the modulated signal and for generating a first reference signal of levels indicative of the frequency characteristics detected thereat;
    discrete signal detection circuitry coupled to receive the electrical signal generated by the means for converting and operative only when the modulated signal comprises a discretely-encoded, modulated signal, said discrete signal detection circuitry for determining frequency characteristics of the electrical signal indicative of the modulated signal and for generating a second reference signal of levels indicative of the frequency characteristics determined thereat; and
    means for altering the oscillation frequency of the variable oscillator responsive to the levels of the first frequency reference signal when the modulated signal comprises a frequency modulated signal and responsive to the levels of the second frequency reference signal when the modulated signal comprises a discretely-encoded, modulated signal, to maintain thereby the variable oscillator of the receiver in the desired frequency relationship with the oscillation frequency of the modulated signal.

2. The frequency control system of claim 1 wherein said means for converting comprises two-stage down-conversion circuitry having a first stage and a second stage.

3. The frequency control system of claim 2 wherein a second stage of the two-stage down-conversion circuitry forms a baseband information signal.

4. The frequency control system of claim 1 further comprising means forming a switch coupled at one side thereof to the variable oscillator and at another side thereof to receive alternately the first reference signal when the information signal is comprised of the frequency modulated signal or the second reference signal when the information signal is comprised of a discrete, encoded signal.

5. The frequency control system of claim 4 wherein said switch is actuated by a signal transmitted by the transmitter.

6. The frequency control system of claim 4 wherein said switch comprises a multiplexer.

7. The frequency control system of claim 1 wherein said means forming discrete signal detection circuitry comprises a digital signal processor.

8. The frequency control system of claim 7 further comprising at least one analog-to-digital converter for converting signals supplied to the digital signal processor into digital form.

9. The frequency control system of claim 7 further comprising at least one digital-to-analog converter for converting the second frequency reference signal generated by the digital signal processor into analog form.

10. The frequency control system of claim 9 wherein said digital-to-analog converter generates a signal of a preset value when the digital signal processor fails to generate the second frequency reference signal.

11. The frequency control system of claim 9 wherein said digital-to-analog converter generates a signal responsive to the first frequency reference signal generated by the phase detector of the analog signal detection circuitry when the digital signal processor fails to generate the second frequency reference signal.

12. In a dual mode transceiver having receiver circuitry including a variable oscillator oscillating at a receiver oscillation frequency forming a portion thereof, the receiver circuitry operative to receive either a frequency modulated signal or a discretely-encoded, modulated signal, the combination with the receiver circuitry of a frequency control system operable to maintain the receiver oscillation frequency of the variable oscillator in a desired frequency relationship with an oscillation frequency of the frequency modulated signal when the frequency modulated signal is received by the receiver circuitry or with an oscillation frequency of the discretely-encoded modulated signal when the discretely-encoded, modulated signal is received by the receiver circuitry, said frequency control system comprising:

analog signal detection circuitry coupled to receive the electrical signal representative of the frequency modulated signal when the frequency modulated signal is received by the receiver circuitry, said analog signal detection circuitry having a phase detector for detecting frequency characteristics of the electrical signal representative of the frequency modulated signal and for generating a first reference signal of levels indicative of the frequency characteristics detected thereat;

discrete signal detection circuitry comprised of a digital signal processor coupled between an analog-to-digital converter and a digital-to-analog converter, the analog-to-digital converter being operative to convert and electrical signal representative of the discretely-encoded, modulated signal when the discretely-encoded, modulated signal is received by the receiver circuitry and to apply digital signals indicative of such tot he digital signal processor, the digital signal processor being operative only when the modulated signal comprises the discretely-encoded, modulated signal for determining frequency characteristics of the electrical signal indicative of the discretely-encoded, modulated signal and for generating a second reference signal of levels indicative of the frequency characteristics determined thereat, and the digital-to-analog converter for converting the second reference signal into analog form; and     a multiplexer forming a switch coupled at one side to the variable oscillator and at a second side to receive, alternately, the first reference signal or the second reference signal, for supplying the first reference signal to the variable oscillator when the frequency modulated signal is received by the receiver circuitry, or alternately, for supplying the second reference signal to the variable oscillator when the discretely-encoded, modulated signal is received by the receiver circuitry 13. A method for maintaining a receiver oscillating frequency of a variable oscillator forming a portion of a receiver in a desired frequency relationship with an oscillation frequency of a modulated signal transmitted to the receiver and received thereat, said method comprising the steps of:

converting the modulated signal received by the receiver into an electrical signal of signal characteristics indicative of the modulated signal;

operating analog signal detection circuitry when the modulated signal comprises a frequency modulated signal, thereby to detect frequency characteristics of the electrical signal indicative of the modulated signal, and generating a first reference signal of levels indicative of the frequency characteristics detected thereat;

operating discrete signal detection circuitry only when the modulated signal comprises a discretely-encoded, modulated signal, thereby to determine frequency characteristics of the electrical signal indicative of the modulated signal and generating a second reference signal of levels indicative of the frequency characteristics determined thereat; and     altering the oscillation frequency of the variable oscillator responsive to the levels of the first frequency reference signal when the modulated signal comprises a frequency modulated signal or, alternately, responsive to the levels of the second frequency reference signal when the modulated signal comprises a discretely-encoded, modulated signal, to maintain thereby the receiver oscillation frequency of the variable oscillator of the receiver in the desired frequency relationship with the oscillation frequency of the modulated signal.

* * * * *

UNITED STATES PATENT AND TRADEMARK OFFICE
CERTIFICATE OF CORRECTION

PATENT NO. : 5,163,159

DATED : November 10, 1992

INVENTOR(S) : Randall W. Rich, Rashid M. Osmani, Thomas J. Walczak, Stephen V. Cahill It is certified that error appears in the above-identified patent and that said Letters Patent is hereby corrected as shown below:

On the title page, Item [75]:
In the inventors section: "Rashid M. Osman" should be —Rashid M. Osmani—.

In column 15, line 19: "...to convert and electrical..." should be —to convert an electrical...—.

In column 15, line 23: "...indicative of such tot he.." should be —..indicative of such to the...—.

In column 16, line 5: "... a receiver oscillating..." should be —...a receiver oscillation...—.

Signed and Sealed this

Seventh Day of December, 1993

*Attest:*

BRUCE LEHMAN

*Attesting Officer*   *Commissioner of Patents and Trademarks*